United States Patent
Oguri

(10) Patent No.: US 7,084,663 B2
(45) Date of Patent: Aug. 1, 2006

(54) IMPEDANCE ADJUSTMENT CIRCUIT, IMPEDANCE ADJUSTMENT METHOD, AND SEMICONDUCTOR DEVICE

(75) Inventor: Takashi Oguri, Tokyo (JP)

(73) Assignee: NEC Corporation, Tokyo (JP)

( * ) Notice: Subject to any disclaimer, the term of this patent is extended or adjusted under 35 U.S.C. 154(b) by 36 days.

(21) Appl. No.: 10/879,214

(22) Filed: Jun. 30, 2004

(65) Prior Publication Data

US 2004/0263235 A1 Dec. 30, 2004

(30) Foreign Application Priority Data

Jun. 30, 2003 (JP) ............................. 2003-188721

(51) Int. Cl.
*H03K 17/16* (2006.01)
(52) U.S. Cl. ........................................ 326/30; 327/334
(58) Field of Classification Search ................. 326/30, 326/11, 35; 327/108, 334; 365/189.05
See application file for complete search history.

(56) References Cited

U.S. PATENT DOCUMENTS

| | | | | |
|---|---|---|---|---|
| 5,606,275 A | * | 2/1997 | Farhang et al. | ............. 327/108 |
| 5,666,078 A | * | 9/1997 | Lamphier et al. | ........... 327/108 |
| 6,307,791 B1 | * | 10/2001 | Otsuka et al. | ......... 365/189.05 |
| 6,573,746 B1 | * | 6/2003 | Kim et al. | ..................... 326/30 |
| 2002/0050838 A1 | | 5/2002 | Kim et al. | |
| 2003/0146774 A1 | | 8/2003 | Coughlin, Jr. et al. | |

FOREIGN PATENT DOCUMENTS

| | | |
|---|---|---|
| EP | 1 111 790 A1 | 6/2001 |
| JP | H08-032435 A | 2/1996 |
| JP | H08-321769 A | 12/1996 |
| JP | H11-017518 A | 1/1999 |
| JP | H11-055106 A | 2/1999 |
| JP | 2000-183717 A | 6/2000 |
| JP | 2001-094048 A | 4/2001 |
| JP | 2001-094409 | 4/2001 |
| JP | 2001-094409 A | 4/2001 |
| JP | 2001-168704 | 6/2001 |
| JP | 2001-168704 A | 6/2001 |
| JP | 2001-217705 A | 8/2001 |

* cited by examiner

*Primary Examiner*—Daniel Chang
(74) *Attorney, Agent, or Firm*—Sughrue Mion, PLLC

(57) ABSTRACT

An impedance adjustment circuit has an external resistor, a comparator which compares the potential of one terminal of the external resistor with a predetermined voltage, a counter whose counted value changes in accordance with an output from the comparator and which outputs a control signal corresponding to the counted value, an NMOS array whose value of resistance changes in accordance with the control signal and which is connected to one terminal of the external resistor and an NMOS arbitration circuit which detects an output from the NMOS comparator a plurality of times and outputs a signal determined by a majority decision logic taken on the detected signals to the counter.

6 Claims, 8 Drawing Sheets

IMPEDANCE ADJUSTMENT CIRCUIT, IMPEDANCE ADJUSTMENT METHOD, AND SEMICONDUCTOR DEVICE

BACKGROUND OF THE INVENTION

1. Field of the Invention

The present invention relates to a semiconductor integrated circuit, and particularly, to an impedance adjustment circuit which can adjust output impedance, input impedance, etc., an impedance adjustment method, and a semiconductor device comprising this impedance adjustment circuit.

2. Description of the Related Art

A high-speed interface is required to function as a sending circuit, a receiving circuit, a transmission line between LSIs, and a distributed constant circuit, and at the same time impedance matching is indispensable for a high-speed interface. The reason is that mismatch between the impedance of a transmission line and the impedance of a load causes a reflected wave, which then invites errors of an input buffer.

Accordingly, a conventional output buffer circuit which performs a high-speed interface function has a built-in resistor at the output side thereof inside an LSI, or has a resistor connected thereto outside the LSI.

According to the method of providing a built-in resistor inside an LSI or providing an external resistor for impedance matching, it is necessary to increase the value of resistance of a resistance element which is not susceptible to influences caused by temperature fluctuation, power supply voltage fluctuation, and process fluctuation, and to enlarge the size of a driver-use MOS transistor in order to make the resistance of the MOS transistor relatively small.

However, if the size of the MOS transistor is enlarged, the LSI will cause a problem that its performance is deteriorated, because of deterioration of mountability inside the LSI, increase in penetrating currents, increase in noises, increase in the amount of electricity consumed, etc.

To cure these adverse influences, recent LSIs have a built-in impedance adjustment circuit. The major adjustment method implemented by such an impedance adjustment circuit is to match the output impedance of an output buffer with an external resistance element having a high degree of precision.

For example, Unexamined Japanese Patent Application KOKAI Publication No. 2001-94048, Unexamined Japanese Patent Application KOKAI Publication No. 2000-183717, Unexamined Japanese Patent Application KOKAI Publication No. H8-321769, Unexamined Japanese Patent Application KOKAI Publication No. H8-32435, and Unexamined Japanese Patent Application KOKAI Publication No. H11-55106 disclose a system for adjusting the impedance of a transistor group (dummy buffer circuit) including one or a plurality of MOS transistors having the same configuration as that of an output buffer by using a comparator and a counter.

Unexamined Japanese Patent Application KOKAI Publication No. 2001-217705 discloses a system for performing impedance adjustment by measuring the impedance of a signal output from an output buffer.

Unexamined Japanese Patent Application KOKAI Publication No. H11-17518 discloses a configuration provided with a dummy transmission line to which an output signal from an output buffer is transmitted, for performing impedance adjustment in consideration of also a change in the impedance that has occurred in the dummy transmission line.

Unexamined Japanese Patent Application KOKAI Publication No. 2001-168704 discloses a system provided with a timer circuit, a logic activation circuit, and an impedance fluctuation detection circuit, for re-performing impedance adjustment after a certain time elapses, to cover fluctuation of the value of resistance caused by a rise of temperature inside the LSI during operation.

Unexamined Japanese Patent Application KOKAI Publication No. 2001-94409 discloses a configuration with improved mountability, improved noiselessness, and reduced amount of electricity consumed, achieved by connecting the same external resistance terminal to both of a PMOS transistor impedance adjustment circuit and an NMOS transistor impedance adjustment circuit.

The contents of these publications are incorporated herein.

With advanced high-speeding of interfaces, a higher-degree of precision of impedance adjustment by an impedance adjustment circuit is required for an output buffer which connects LSIs with each other. Therefore, it is necessary to reduce unevenness in the adjusted impedance to make the impedance accurately coincide with the level of the external resistance.

Therefore, for example, a detector (comparator) is required to have a high degree of detection precision.

However, since an impedance adjustment circuit is placed inside an LSI, it might cause errors due to noises (power source noises, etc.) caused by itself or noises received from surrounding circuits. That is, it is important to remove errors caused by these noises to improve the detection precision.

For example, the degree of precision in detecting a potential required of a comparator is around several mV, when the power supply voltage is 1V.

However, since a noise in an LSI has around several ten mV, errors will be caused if a noise is mixed into a detection signal from the comparator.

When considering the above-described prior art in view of this point, each of them is a system having a view to raising the detection precision of a detector, but not a system having a view to reducing errors caused by noises, or a system capable of reducing influences of errors caused by noises.

SUMMARY OF THE INVENTION

The present invention was made in view of these conventional problems, and an object of the present invention is to provide an impedance adjustment circuit capable of preventing errors caused by noises.

Specifically, an object of the present invention is to provide an impedance adjustment circuit capable of, if noises are mixed, removing influences of the noises.

To achieve the above objects, an impedance adjustment circuit according to a first aspect of the present invention is an impedance adjustment circuit which performs simulation of a behavior of an array circuit and adjusts an impedance of the array circuit in accordance with a simulation result, and performs the simulation a plurality of times at different timings, and adjusts the impedance of the array circuit in accordance with a majority decision logic taken on results of the simulation performed the plurality of times.

In the above-described impedance adjustment circuit, the array circuit may be constituted by a transistor array, and the impedance adjustment circuit may comprise: an adjusting array circuit which simulates the behavior of the array circuit; a plurality of sampling circuits which sample results of simulation by the adjusting array circuit at different timings; and an adjustment circuit which controls a behavior of the adjusting array circuit and also controls turning on/off of transistors constituting the array circuit in accordance with a majority decision logic taken on outputs from the plurality of sampling circuits.

A semiconductor device according to a second aspect of the present invention comprises: an adjusting-target impedance circuit which is constituted by a parallel circuit made up of a plurality of transistors; and an impedance adjustment circuit which adjusts an impedance of the impedance circuit, wherein the impedance adjustment circuit includes: a signal line; an adjusting impedance circuit whose one terminal is connected to the signal line and whose other terminal has a first voltage applied thereto, and which is constituted by a parallel circuit made up of a plurality of transistors; a comparison circuit which compares a voltage of the signal line with a second voltage; sampling circuits which sample outputs from the comparison circuit at different timings; majority decision circuits which arbitrate the outputs from the comparison circuit sampled at a plurality of timings by the sampling circuits in accordance with a majority decision logic, and output an arbitration output; and a control circuit which updates a counted value in accordance with the output from the majority decision circuits, and controls each transistor constituting the adjusting-target impedance circuit and each transistor constituting the adjusting impedance circuit in accordance with the counted value.

With this configuration, even if an erroneous determination or an erroneous measurement is generated due to a noise (power supply noise, etc.) caused in the impedance adjustment circuit or a noise coming from surrounding circuits, final adjustment is made by processing an output from the comparison circuit sampled at different timings in accordance with a majority decision logic. Accordingly, an erroneous signal or erroneous measurement is removed and a proper output is likely to be obtained. As a result, impedance adjustment can appropriately be performed.

A semiconductor device according to a third aspect of the present invention comprises an adjusting-target impedance circuit which is constituted by a plurality of transistors; and an impedance adjustment circuit which adjusts an impedance of the impedance circuit, wherein the impedance adjustment circuit includes: a signal line; an adjusting impedance circuit whose one terminal is connected to the signal line and whose other terminal has a first voltage applied thereto, and which is constituted by a plurality of transistors; a comparison circuit which compares a voltage of the signal line with a second voltage; sampling circuits which sample outputs from the comparison circuit in response to a plurality of timing signals; majority decision circuits which arbitrate the plurality of outputs from the comparison circuit sampled by the sampling circuits in accordance with a majority decision logic, and output an arbitration output; and a control circuit which updates a counted value in accordance with the output from the majority decision circuits, and controls each transistor constituting the adjusting-target impedance circuit and each transistor constituting the adjusting impedance circuit in accordance with the counted value.

With this configuration, even if an erroneous determination or an erroneous measurement is obtained from sampling performed in response to any of the timing signals due to a noise (power supply noise, etc.) caused in the impedance adjustment circuit or a noise coming from surrounding circuits, an erroneous signal or erroneous measurement is removed due to proper determination or measurement obtained from sampling performed in response to other timing signals, and thus a proper output is likely to be obtained. As a result, impedance adjustment can appropriately be performed.

An impedance adjustment circuit according to a fourth aspect of the present invention comprises: an adjusting-target impedance circuit which is constituted by a plurality of transistors; a signal line; an adjusting impedance circuit whose one terminal is connected to the signal line and whose other end has a first voltage applied thereto, and which is constituted by a plurality of transistors; a comparison circuit which compares a voltage of the signal line with a second voltage; sampling circuits which sample outputs from the comparison circuit at different timings; majority decision circuits which arbitrate the outputs from the comparison circuit sampled at a plurality of timings by the sampling circuits in accordance with a majority decision logic, and output an arbitration output; and a control circuit which updates a counted value in accordance with the output from the majority decision circuits, and controls each transistor constituting the adjusting-target impedance circuit and each transistor constituting the adjusting impedance circuit in accordance with the counted value.

An impedance adjustment method according to a fifth aspect of the present invention is an impedance adjustment method for adjusting an impedance of an adjusting-target impedance circuit which is constituted by a plurality of transistors, the method comprising: comparing an output voltage of a voltage dividing circuit which is constituted by an adjusting reference impedance and an adjusting impedance circuit constituted by a parallel circuit made up of a plurality of transistors, with a predetermined reference voltage, and outputting a comparison result; sampling the comparison result at different timings; arbitrating the comparison result sampled at a plurality of timings in accordance with a majority decision logic, and outputting an arbitration result; and controlling each transistor constituting the adjusting-target impedance circuit and each transistor constituting the adjusting impedance circuit in accordance with the arbitration result.

BRIEF DESCRIPTION OF THE DRAWINGS

These objects and other objects and advantages of the present invention will become more apparent upon reading of the following detailed description and the accompanying drawings in which.

DETAILED DESCRIPTION OF THE PREFERRED EMBODIMENT

An impedance adjustment circuit according to an embodiment of the present invention will now be explained with reference to the drawings.

First, the entire configuration of a semiconductor integrated circuit including an impedance adjustment circuit will be explained with reference to a circuitry diagram shown in FIG. 1.

Figure 1:
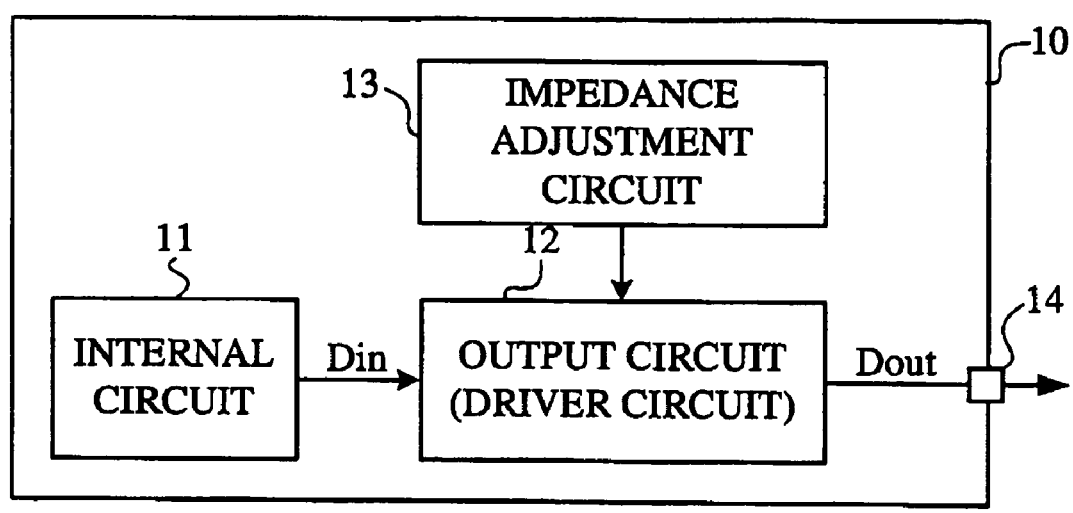
FIG. 1 is a diagram showing an example of configuration of a semiconductor device having an impedance adjustment circuit according to an embodiment of the present invention.

As shown in FIG. 1, a semiconductor device (hereinafter referred to as LSI) 10 comprises an internal circuit 11, an output circuit 12, and an impedance adjustment circuit 13.

The internal circuit 11 performs various signal processes and outputs a signal Din to be output outside the LSI 10. The signal Din is a binary signal having a high level and a low level.

The output circuit 12 expands the dynamic range and current-driving capability of the signal Din output from the internal circuit 11, and outputs the expanded signal as a signal Dout. The signal Dout is output to the outside via an output terminal 14 of the LSI 10.

The impedance adjustment circuit 13, which is the feature of the present invention, is provided for adjusting the output impedance of the output circuit 12.

Next, an example of configuration of the output circuit 12 will be explained with reference to the circuitry diagram shown in FIG. 2.

Figure 2:
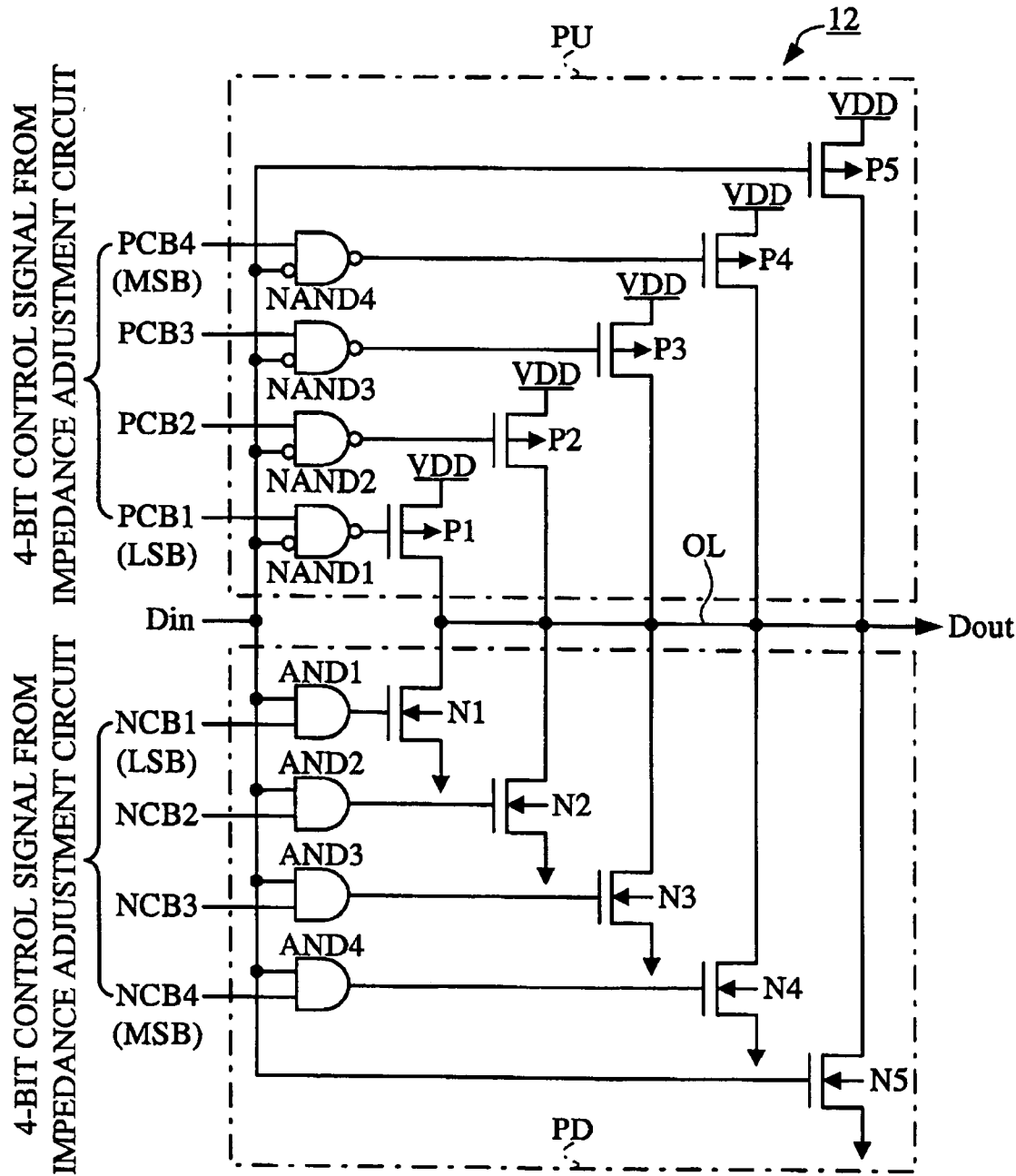
FIG. 2 is a circuitry diagram showing an example of configuration of an output circuit shown in FIG. 1.

As shown in FIG. 2, the output circuit 12 comprises a pull-down circuit PD for pulling down the voltage of an output line OL through which the signal Dout is output to a ground voltage level, and a pull-up circuit PU for pulling up the voltage of the output line OL to the level of a power supply voltage VDD.

The pull-down circuit PD and pull-up circuit PU of the output circuit 12 are the target circuits of impedance adjustment, and are also called array circuit formed by a transistor array, or called impedance circuit The pull-down circuit PD comprises NMOS transistors N1 to N5, and AND gates AND1 to AND4.

Each of the NMOS transistors N1 to N5 has its drain connected to the output line OL and its source grounded.

On-resistance between source and drain of the transistors N1 to N4 is weighted. If the on-resistance and conductance of the NMOS transistor N1 are assumed to be Rn1 and Cn1 respectively, the on-resistance and conductance of the NMOS transistor N2 are 2·Rn1 and Cn1/2, the on-resistance and conductance of the NMOS transistor N3 are 4·Rn1 and Cn1/4, and the on-resistance and conductance of the NMOS transistor N4 are 8·Rn1 and Cn1/8.

The on-resistance and conductance of the NMOS transistor N5 are adequately set such that, for example, the impedance of a parallel circuit between the NMOS transistors N1 and N5 corresponds to the output impedance that should be obtained by the output circuit 12.

One input terminal of each of the AND gates AND1 to AND4 is connected to a data input terminal, so that data Din is input from the internal circuit 11. The other input terminal of each of the AND gates AND1 to AND4 receives an input of a corresponding one of bits NCB1 (LSB) to NCB4 (MSB) of a 4-bit binary control signal from the impedance adjustment circuit 13 in one-to-one correspondence.

The output terminals of the AND gates AND1 to AND4 are connected to the gates of the NMOS transistors N1 to N4 respectively. The gate of the NMOS transistor N5 is directly supplied with the data Din.

The NMOS transistors N1 to N5 are basically turned on when a received input signal is at a high (H) level to pull down the voltages of signal lines to the ground level, and is turned off when an input signal is at a low (L) level.

It should be noted that since the AND gates AND1 to AND4 are opened or closed depending on the values of the binary control signals NCB1 to NCB4 supplied from the impedance adjustment circuit 13, a combination of NMOS transistors N1 to N5 that can be turned on is determined by the binary control signals NCB1 to NCB4.

Figure 3:
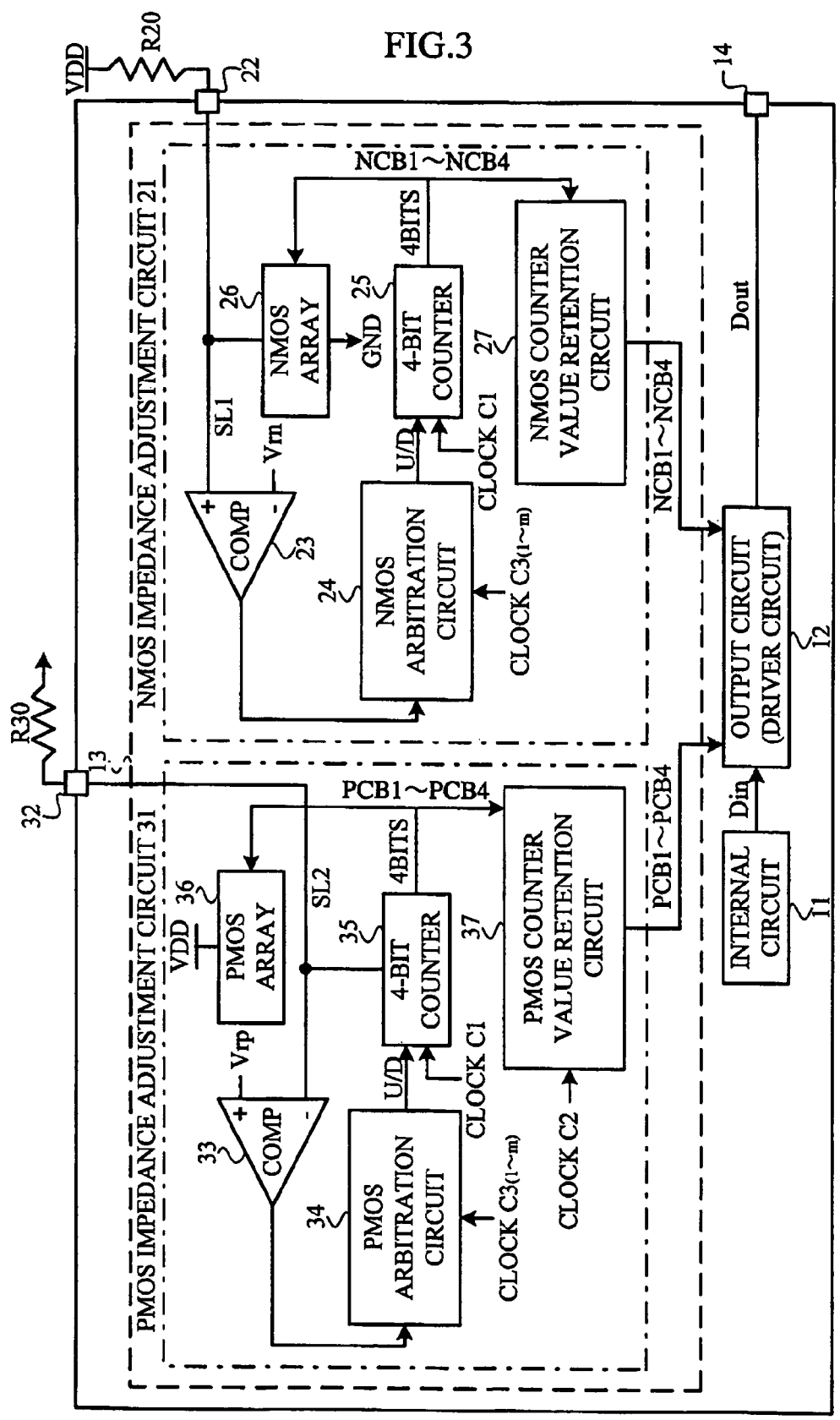
FIG. 3 is a circuitry diagram showing an example of configuration of an impedance adjustment circuit shown in FIG. 1.

As will be described, the binary control signals NCB1 to NCB4 are set such that the combined resistance of the NMOS transistors N1 to N5 that are turned on corresponds to the value of resistance of a high precision external resistor for impedance adjustment (reference resistor) R20 (FIG. 3).

The pull-up circuit PU comprises PMOS transistors P1 to P5, and NAND gates NAND1 to NAND4.

The inverting input terminal of each of the NAND gates NAND1 to NAND4 is connected to the data input terminal, so that data D1 is input from the internal circuit 11.

The non-inverting input terminal of each of the NAND gates NAND1 to NAND4 receives an input of a corresponding one of bits PCB1 (LSB) to PCB4 (MSB) of a 4-bit binary control signal from the impedance adjustment circuit 13 in one-to-one correspondence.

Each of the PMOS transistors P1 to P5 has its drain connected to the output line OL, and its source connected to the power supply voltage VDD.

The on-resistance between source and drain of the PMOS transistors P1 to P4 is weighted. If the on-resistance and conductance of the PMOS transistor P1 are assumed to be Rp1 and Cp1 respectively, the on-resistance and conductance of the PMOS transistor P2 are 2·Rp1 and Cp1/2, the on-resistance and conductance of the PMOS transistor P3 are 4·Rp1 and Cp1/4, and the on-resistance and conductance of the PMOS transistor P4 are 8·Rp1 and Cp1/8.

The on-resistance and conductance of the PMOS transistor P5 are adequately set such that, for example, the impedance of a parallel circuit between the PMOS transistors P1 and P5 corresponds to the output impedance that should be obtained by the output circuit 12.

The output terminals of the NAND gates NAND1 to NAND4 are connected to the gates of the PMOS transistors P1 to P4 respectively. The gate of the PMOS transistor P5 is directly supplied with the data Din.

The PMOS transistors P1 to P5 are basically turned on when an input signal is at a low (L) level to pull up the voltages of signal lines to the power supply voltage VDD, and are turned off when an input signal is at a high (H) level.

It should be noted that since the NAND gate NAND1 to NAND4 are opened and closed depending on the values of the binary control signals PCB1 (LSB) to PCB4 (MSB) supplied from the impedance adjustment circuit 13, a combination of PMOS transistors P1 to P5 that can be turned on is determined by the binary control signals.

As will be described later, the binary control signals PCB1 to PCB4 are set such that the combined resistance of the PMOS transistors P1 to P5 that are turned on corresponds to the value of resistance of a high precision external resistor for impedance adjustment R30 (FIG. 3).

Next, an example of configuration of the impedance adjustment circuit 13 will be explained with reference to a circuitry diagram shown in FIG. 3.

As shown in FIG. 3, the impedance adjustment circuit 13 comprises an NMOS impedance adjustment circuit 21, and a PMOS impedance adjustment circuit 31.

The NMOS impedance adjustment circuit 21 comprises an external resistor connection terminal 22, an NMOS comparison circuit (comparator) 23, an NMOS arbitration circuit 24, a counter 25, an NMOS array (transistor array) 26, and an NMOS counter value retention circuit 27.

One terminal of an external resistor R20, which is a precise reference resistor outside the LSI 10, is connected to the external resistor connection terminal 22. A voltage VDD is applied to the other terminal of the external resistor R20.

Inside the NMOS impedance adjustment circuit 21, the non-inverting input terminal of the NMOS comparator 23 is connected to the external resistor connection terminal 22, and the inverting input terminal thereof has a reference potential Vrn applied thereto.

The reference potential Vrn is set to, for example, VDD/2. In other words, the NMOS comparator 23 compares the external resistor R20 with the impedance of the NMOS array 26 by comparing a divisional voltage of the power supply voltage VDD divided by the external resistor R20 together with the NMOS array 26 with the reference potential Vrn to measure the impedance of the NMOS array 26, and outputs the measurement result.

The NMOS comparator 23 compares a voltage supplied to its non-inverting input terminal and the reference potential Vrn supplied to its inverting input terminal, and outputs a high-level signal when the voltage supplied to the non-inverting input terminal is higher, and outputs a low-level signal when the voltage supplied to the non-inverting input terminal is lower.

The NMOS arbitration circuit 24 receives an output from the NMOS comparator 23 and a plurality of clock (timing) signals C3 ($C3_1$ to $C3_m$), takes a majority decision on the voltage level of the output signal D1 of the NMOS comparator 23, and outputs the decision.

Specifically, the NMOS arbitration circuit 24 determines the signal level of the output signal of the NMOS comparator 23 at an "m" number of different timings indicated by the plurality of clock signals C3, and based on a majority decision, outputs a signal having a signal level which appears the most often.

An example of configuration of the NMOS arbitration circuit 24 will be explained with reference to a circuitry diagram shown in FIG. 4(a).

The NMOS arbitration circuit 24 is a circuit which detects the output from the NMOS comparator 23 equal to or more than three times, and outputs a signal determined by majority decision logic (UD) taken on the detected signals.

Figure 4A:
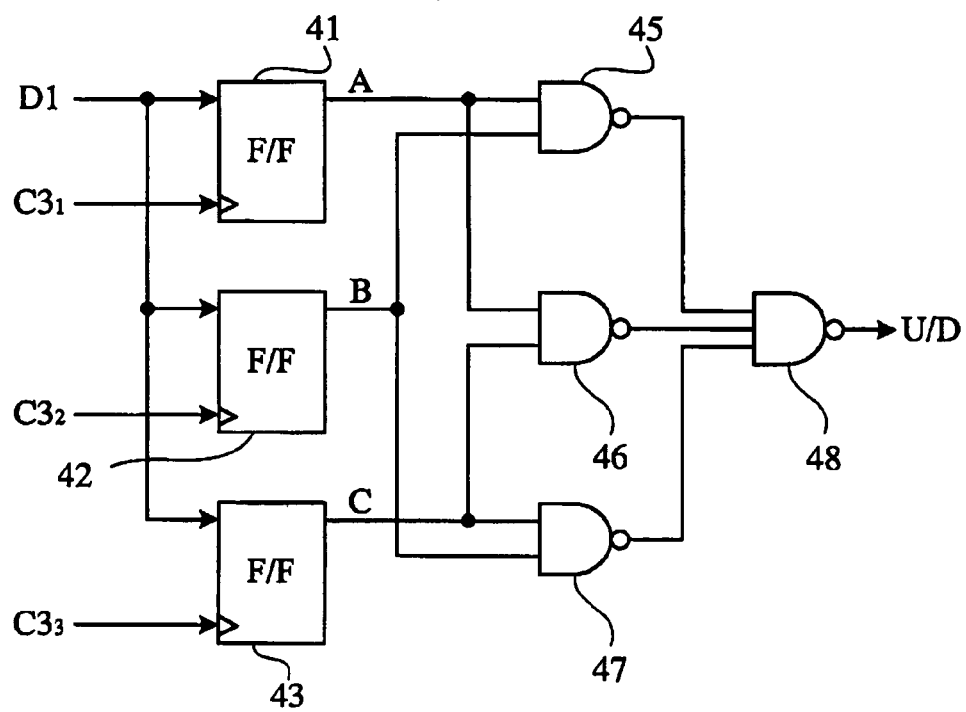
FIG. 4A is a circuitry diagram showing an example of configuration of an arbitration circuit shown in FIG. 3.

The arbitration circuit shown in FIG. 4(a) illustrates a case where the number of clock signals $C3_i$ to $C3_m$ is 3 (m=3).

The NMOS arbitration circuit 24 is a circuit which detects the output from the NMOS comparator 23 three times, and outputs a signal determined by majority decision logic taken on the detected signals. The NMOS arbitration circuit 24 comprises three flip-flops (F/F) 41, 42, and 43, and four NAND gates 45, 46, 47, and 48 for majority decision logic.

The first F/F 41 latches (samples) the output signal D1 from the NMOS comparator 23 in synchronization with a rising edge of the clock signal C31.

The second F/F 42 latches (samples) the output signal D1 from the NMOS comparator 23 in synchronization with a rising edge of the clock signal C32.

The third F/F 43 latches (samples) the output signal D1 from the NMOS comparator 23 in synchronization with a rising edge of the clock signal C33.

Figure 4B:
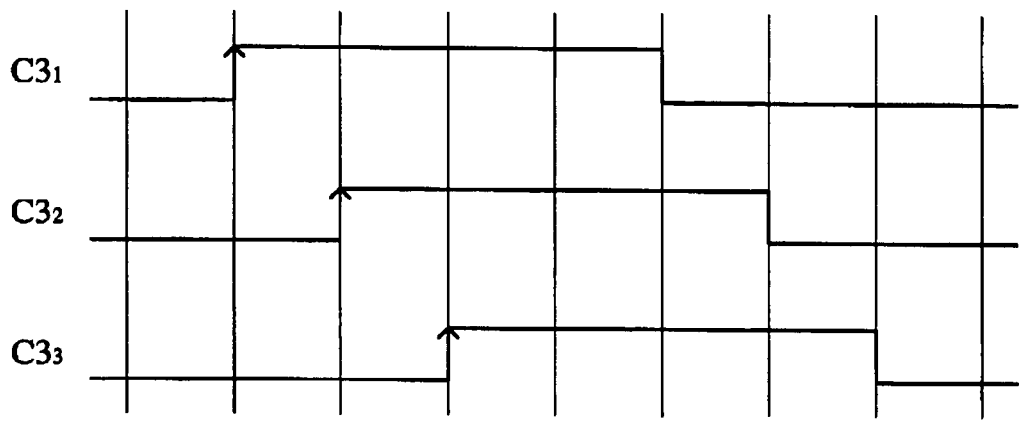
FIG. 4B is a timing chart showing an example of clock signals to be supplied to the arbitration circuit.

The three clock signals $C3_1$, $C3_2$, and $C3_3$ are clock signals whose phases lag respectively, as shown in FIG. 4(b). That is, the F/Fs 41, 42, and 43 function as a latch circuit (sampling circuit).

Assume that outputs from the three F/Fs 41, 42, and 43 are A, B, and C respectively. All the combinations made up of two of these outputs A, B, and C are supplied to the input terminals of two-input NAND gates 45, 46, and 47. Further, outputs from the NAND gates 45, 46, and 47 are supplied to a three-input NAND gate 48.

As a result, among the three signals A, B, and C (high level or low level), either of the signals that is selected by majority decision is output from the NAND gate 48 as an output signal U/D. That is, the NAND gates 45, 46, and 47 function as a majority decision circuit.

The counter 25 shown in FIG. 3 is a 4-bit UP/DOWN counter. The counter 25 receives an output signal from the NMOS arbitration circuit 24 and a clock signal C1 and determines the signal level of the output signal from the NMOS arbitration circuit 24 at a rising edge of the clock signal C1. The counter 25 increments its counted value by 1 if the output signal is at a high level, decreases its counted value by 1 if the output signal is a low level, and outputs a 4-bit counted value NCB1 (LSB) to NCB4 (MSB).

As a result, each transistor constituting the adjusting-target impedance circuit and each transistor constituting the adjusting impedance circuit can be controlled. Therefore, the counter 25 functions as a control circuit.

The NMOS counter value retention circuit 27 acquires the 4-bit output signal of the counter 25 in synchronization with a clock signal C2 and retains it, and output the retained 4 bit binary signal as the above-described control signals NCB1 (LSB) to NCB4 (MSB).

Figure 5:
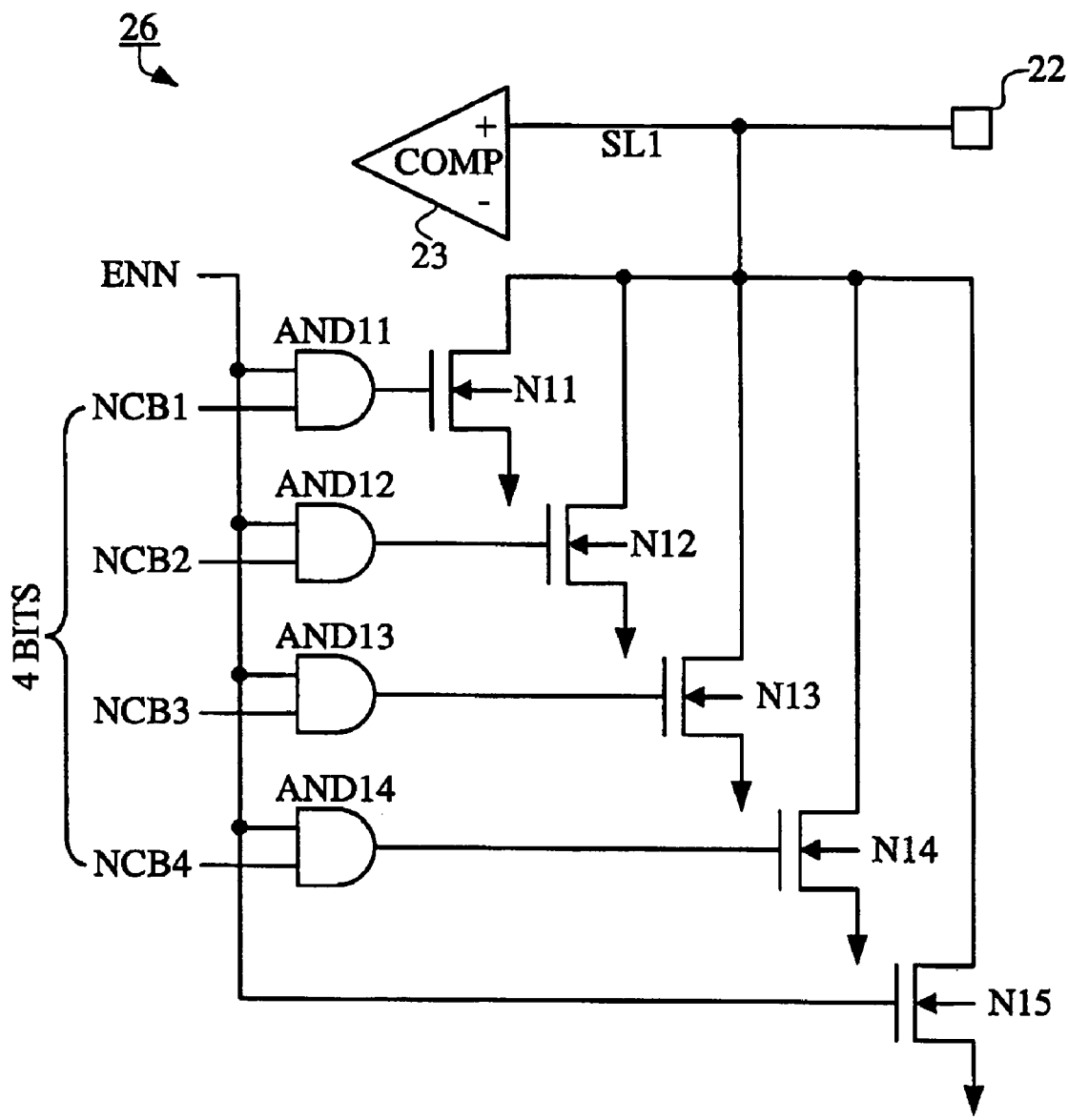
FIG. 5 is a circuitry diagram showing an example of configuration of an NMOS array shown in FIG. 3.

Next, the NMOS array 26 will be explained with reference to a circuitry diagram shown in FIG. 5.

The NMOS array 26 is a circuit which pulls down a signal line SL1 connecting the external resistor connection terminal 22 and the non-inverting input terminal of the NMOS comparator 23, and also a circuit which simulates the behaviors and characteristics of the pull-down circuit PD of the output terminal 12.

In other words, the NMOS array 26 is a circuit which divides the power supply voltage VDD together with the external resistor R20 connected to the external resistor connection terminal 22. Therefore, the NMOS array 26 is also called adjusting array circuit for simulating the behavior of an array circuit, or called adjusting impedance circuit. That is, the configuration of the NMOS array 26 is substantially the same as that of the pull-down circuit PD of the output circuit 12 shown in FIG. 2. The NMOS array 26 is manufactured by following the same manufacturing process with the size, etc. of each transistor being the same. However, it should be noted that the input signal Din is replaced with an enable signal ENN. As shown in FIG. 5, the NMOS array 26 has a configuration in which five NMOS transistors N11 to N15 are connected in parallel between the signal line SL1 and the ground.

The gate terminals of the NMOS transistors N11 to N14 are connected to the output terminals of AND gates AND11 to AND14 respectively. One input terminal of each of the AND gates AND11 to AND14 receives the enable signal ENN, and the other input terminal thereof is supplied with a corresponding one of the output signals NCB1 to NCB4 of the counter 25.

The gate of the NMOS transistor N15 is directly supplied with the enable signal ENN.

The on-resistance between source and drain of each of the NMOS transistors N11 to N14 is weighted. If the on-resistance and conductance of the NMOS transistor N11 are assumed to be Rn11 and Cn11 respectively, the on-resistance and conductance of the NMOS transistor N12 are 2·Rn11 and Cn11/2, the on-resistance and conductance of the NMOS transistor N13 are 4·Rn11 and Cn11/4, and the on-resistance and conductance of the NMOS transistor N14 are 8·Rn11 and Cn11/8.

The on-resistance and conductance of the NMOS transistor N15 are adequately set, for example, depending on the output impedance that should be obtained by the output circuit 12.

To facilitate understanding, according to the present embodiment, the NMOS transistors N11 to N14 have substantially the same configuration, size, and characteristics as those of the NMOS transistors N1 to N4.

Likewise the pull-down circuit PD, transistors that can be turned on are determined by the 4-bit binary signals NCB1 to 4 from the counter 25. The value of resistance of the NMOS array 26 at the time of pull-down is determined depending on combinations of transistors that are actually turned on.

The enable signal ENN is a signal which is set to a high level when an impedance adjustment process is performed.

The PMOS impedance adjustment circuit 31 shown in FIG. 3 comprises an external resistor connection terminal 32, a PMOS comparison circuit (comparator) 33, a PMOS arbitration circuit 34, a counter 35, a PMOS array (transistor array) 36, and a PMOS counter value retention circuit 37.

One terminal of an external resistor (reference resistor) R30, which is a precise reference resistor outside the LSI 10, is connected to the external resistor connection terminal 32. The other terminal of the external resistor R30 is grounded.

Inside the PMOS impedance adjustment circuit 31, the inverting input terminal of the PMOS comparator 33 is connected to the external resistor connection terminal 32 through a signal line SL2, and the non-inverting input terminal thereof has a reference potential Vrp applied thereto.

The reference potential is set to, for example, VDD/2. In other words, the PMOS comparator 33 compares the external resistance R30 with the impedance of the PMOS array 36 by comparing a divisional voltage of the power supply voltage VDD divided by the external resistor R30 together with the PMOS array 36 with the reference potential Vrp to measure the impedance of the PMOS array 36, and outputs the measurement result.

The PMOS comparator 33 compares a voltage supplied to its inverting input terminal with the reference potential Vrp supplied to its non-inverting input terminal. The PMOS comparator 33 outputs a high-level signal when the voltage supplied to the non-inverting input terminal is higher, outputs a low-level signal when the voltage supplied to the non-inverting input terminal is lower, and outputs a middle-level signal when both are the same.

The PMOS arbitration circuit 34 receives an output from the PMOS comparator 33 and a plurality of clock signals C3, takes a majority decision on the voltage level of the output signal D1 from the PMOS comparator 33, and outputs the decision.

Specifically, the PMOS arbitration circuit 34 determines the signal level of the output signal D1 from the PMOS comparator 33 at an "m" number of different timings indicated by the plurality of clock signals $C3_1$ to $C3_m$, and based on a majority decision, outputs a signal having a signal level which appears most often.

The configuration of the PMOS arbitration circuit 34 in case of m=3 is the same as that shown in FIG. 4(a).

The counter 35 shown in FIG. 3 is a 4-bit UP/DOWN counter. The counter 35 receives an output signal of the PMOS arbitration circuit 34 and a clock signal C1. The counter 35 determines the signal level of the output signal of the PMOS arbitration circuit 34 at a rising edge of the clock signal C1. The counter 35 increments its counted value by 1 if the signal level is at a high level, decreases the counted value by 1 if the signal level is at a low level, and outputs 4-bit counted values PBC1 (LSB) to PBC4 (MSB).

As a result, the counter 35 controls each transistor constituting the adjusting-target impedance circuit and each transistor constituting the adjusting impedance circuit, and thus functions as a control circuit.

The PMOS counter value retention circuit 37 acquires the 4-bit output signals from the counter 35 in synchronization with a clock signal C2 and retains them, and outputs the retained 4-bit binary signals as the above-described control signals PCB1 (LSB) to PCB4 (MSB).

The PMOS array 36 is a circuit for pulling up the signal line SL2 which connects the external resistor connection terminal 32 with the inverting input terminal of the PMOS comparator 33, and is a circuit for simulating the behaviors and characteristics of the pull-up circuit PU of the output circuit 12.

In other words, the PMOS array 36 is a circuit which divides the power supply voltage VDD together with the external resistor R30 connected to the external resistor connection terminal 32. Therefore, the PMOS array 36 is also called adjusting array circuit for simulating the behaviors of an array circuit, or called adjusting impedance circuit. The basic configuration of the PMOS array 36 is the same as that of the pull-up circuit PU of the output circuit 12 shown in FIG. 2. However, the input signal Din is replaced with an enable signal ENP.

Figure 6:
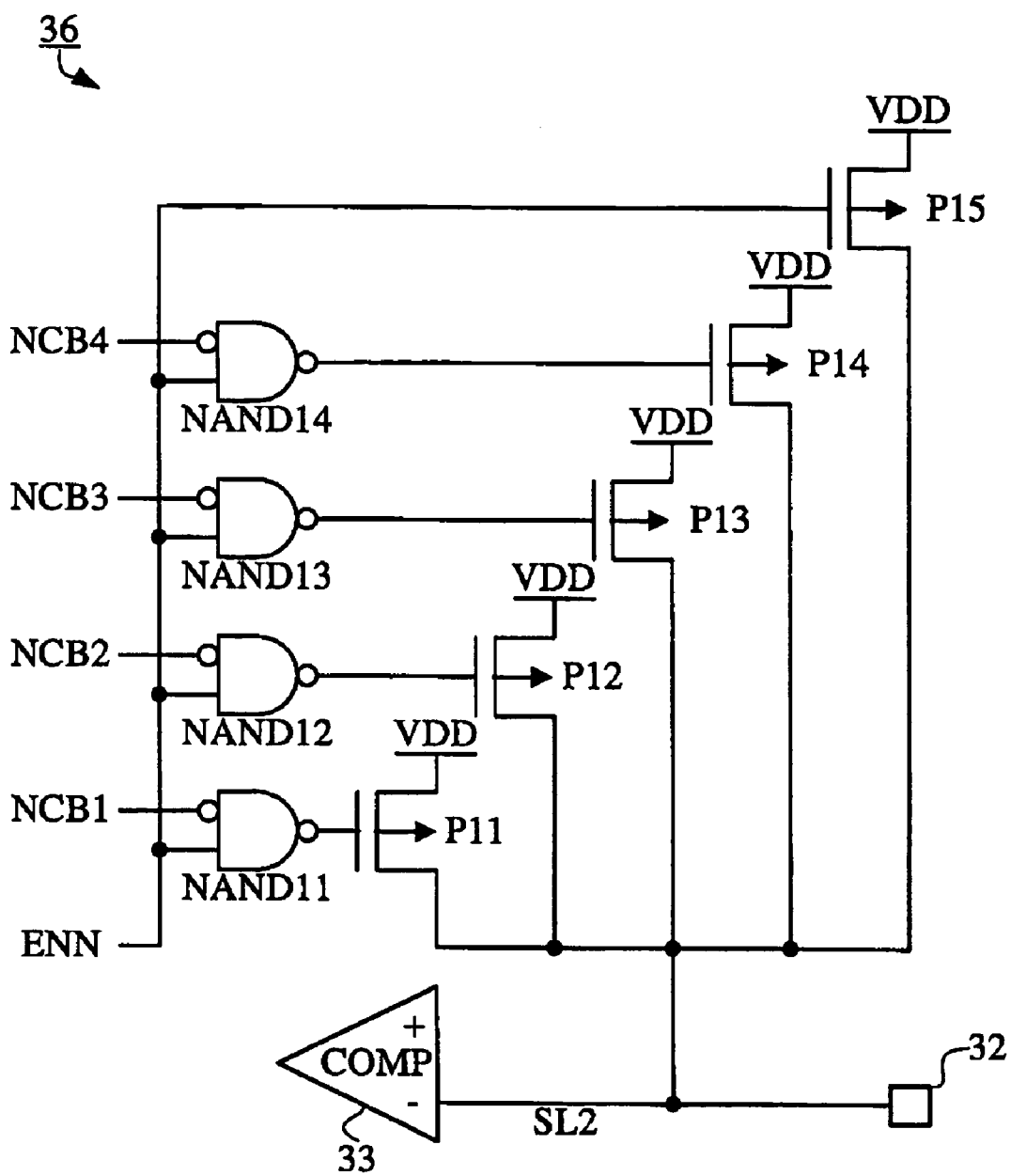
FIG. 6 is a circuitry diagram showing an example of configuration of a PMOS array shown in FIG. 3.

That is, the PMOS array 36 has a configuration in which, as shown in FIG. 6, five P type MOS transistors P11 to P15 are connected in parallel between the signal line SL2 and the power supply voltage VDD.

The gates of the PMOS transistors P11 to P14 are connected to the output terminals of NAND gates NAND11 to NAND14 respectively. One input terminal of each of the NAND gates NAND11 to NAND14 receives the enable signal ENP, and the other input terminal (inverting input terminal) thereof is supplied with the output signals PCB1 to PCB4 of the counter 35.

The gate of the PMOS transistor P5 is directly supplied with the enable signal ENP.

The on-resistance between source and drain of the PMOS transistors P11 to P14 is weighted. If the on-resistance and conductance of the PMOS transistor P11 are assumed to be Rp11 and Cp11 respectively, the on-resistance and conductance of the PMOS transistor P12 are 2·Rp11 and Cp11/2, the on-resistance and conductance of the PMOS transistor P13 are 4·Rp11 and Cp11/4, and the on-resistance and conductance of the PMOS transistor P4 are 8·Rp11 and Cp11/8.

The on-resistance and conductance of the PMOS transistor P15 are adequately set, for example, depending on the output impedance which should be obtained by the output circuit 12.

For easier understanding, according to the present embodiment, the PMOS transistors P11 to P14 have substantially the same configuration, size and characteristics as those of the PMOS transistors P1 to P4.

Likewise the pull-up circuit PU, the transistors that can be turned on are determined by the 4-bit binary signals PCB1 to PCB4 from the counter 35. And the value of resistance of the PMOS array 36 at the time of pull-up is determined depending on combinations of transistors that are actually turned on.

The enable signal ENP is a signal which is set to a high level when an impedance adjustment process is performed.

Next, an output impedance adjustment operation of the LSI 10 according to the present embodiment will be explained.

The value of resistance (output impedance) of the pull-down circuit PD of the output circuit 12 is set by the NMOS impedance adjustment circuit 21, and the value of resistance (output impedance) of the pull-up circuit PU is set by the PMOS impedance adjustment circuit 31.

First, an operation for adjusting the impedance of the pull-down circuit PD which is performed by activating the NMOS impedance adjustment circuit 21 will be explained.

First, the enable signal ENN is set to "on" (high level), and the clock signals C1, C2, and $C3_1$ to $C3_3$ are supplied.

The voltage of the signal line SL1 pulled up to the power supply voltage by the external resistor R20 connected to the external resistor connection terminal 22 and pulled down to the ground by the NMOS array 26, that is, the power supply voltage VDD divided by the external resistor R20 and the NMOS array 26 is supplied to the non-inverting input terminal of the NMOS comparator 23.

The NMOS comparator 23 compares the supplied voltage with the reference potential Vrn.

In a case where the voltage of the signal line SL1 is higher than the reference potential Vn, the NMOS comparator 23 outputs a high-level signal. This signal is input to the NMOS arbitration circuit 24, and a high-level signal is output from the NMOS arbitration circuit 24. Then, this signal is input to the counter 25, which then increments the counted value by 1.

Therefore, the value of 4-bit binary output NCB1 to NCB4 from the counter 25 is also incremented by 1. Because of this, among the AND gates AND11 to AND14 of the NMOS array 26, higher-order AND gates are opened, and NMOS transistors having smaller on-resistance are turned on.

As a result, the value of resistance between the signal line SL1 and the ground (the value of resistance of a parallel circuit made up of the transistors N11 to N15 constituting the NMOS array 26) decreases, and the potential of the signal line SL1 drops. In this way, when the potential of the signal line SL1 is higher than the reference potential Vrn, the counter 25 upcounts and the value of resistance of the NMOS array 26 decreases.

To the contrary, in a case where the voltage of the signal line SL1 is lower than the reference potential Vrn, the NMOS comparator 23 outputs a low-level signal This signal is input to the NMOS arbitration circuit 24, and a low-level signal is output from the NMOS arbitration circuit 24. Then, this signal is input to the counter 25, and the counter 25 decreases the counted value by 1.

Because of this, the value of the 4-bit binary output NCB1 to NCB4 output from the counter 25 is also decreased by 1. Therefore, among the AND gates AND11 to AND14 of the NMOS array 26, higher-order AND gates are closed, and NMOS transistors having smaller on-resistance are turned off.

As a result, the value of resistance between the signal line SL1 and the ground (the value of resistance of the parallel circuit made up of the transistors N11 to N15 constituting the NMOS array 26) increases, and the potential of the signal line SL1 increases. In this way, when the potential of the signal line SL1 is lower than the reference potential Vrn, the counter 25 downcounts, and the value of resistance of the NMOS array 26 increases.

The 4-bit binary signals output from the counter 25 are supplied to the NMOS counter value retention circuit 27. The NMOS counter value retention circuit 27 retains the binary control signals NCB1 to NCB4 in response to the clock signal C2. By the binary control signal being supplied to the pull-down circuit PD, the pull-down resistance of the pull-down circuit PD becomes the value same as that of the pull-down resistance of the NMOS array 26, i.e., becomes the same as that of the external resistor R20. Next, an operation for adjusting the impedance of the pull-up circuit PU which is performed by activating the PMOS impedance adjustment circuit 31 will be explained.

First, the enable signal ENP is set to "on" (high level), and the clock signals C1, C2, and $C3_1$ to $C3_3$ are supplied.

The voltage of the signal line SL2 which is pulled down to the ground by the external resistor connection terminal 32 and pulled up to the power supply voltage VDD by the PMOS array 36, that is, the power supply voltage VDD divided by the external resistor R30 and the PMOS array 36 is supplied to the inverting input terminal of the PMOS comparator 33.

The PMOS comparator 33 compares the supplied voltage with the reference potential Vrp.

In a case where the voltage of the signal line SL2 is higher than the reference potential Vrp, the PMOS comparator 33 output a low-level signal. This signal is input to the PMOS arbitration circuit 34, and a low-level signal is output from the PMOS arbitration circuit 34. Then, this signal is input to the counter 35, and the counter decreases the counted value by 1.

Because of this, the value of the 4-bit binary outputs PCB1 to PCB4 output from the counter 35 also decreases by 1. Therefore, among the NAND gates NAND11 to NAND14 of the PMOS array 36, higher-order NAND gates become closed, and PMOS transistors having smaller on-resistance are turned off.

As a result, the value of resistance between the signal line SL2 and the power supply voltage VDD increases, and the potential of the signal line SL2 drops. In this way, when the potential of the signal line SL2 is higher than the reference potential Vrp, the counter 35 downcounts, and the value of resistance of the PMOS array 36 increases.

To the contrary, when the voltage of the signal line SL2 is lower than the reference potential Vrp, the PMOS comparator 33 outputs a high-level signal. This signal is input to the PMOS arbitration circuit 34, and a high-level signal is output from the PMOS arbitration circuit 34. This signal is input to the counter 35, and the counter increments the counted value by 1.

Therefore, the value of the 4-bit binary outputs PCB1 to PCB4 output from the counter 35 is also increased by 1. Thus, among the NAND gates NAND11 to NAND14 of the PMOS array 36, higher-degree NAND gates become opened, and PMOS transistors having smaller on-resistance are turned on.

As a result, the value of resistance between the signal line SL2 and the power supply voltage VDD decreases, and the potential of the signal line SL2 increases. In this way, in a case where the potential of the signal line SL2 is lower than the reference potential Vrp, the counter 35 upcounts and the value of resistance of the PMOS array 36 decreases.

The 4-bit binary signals output from the counter 35 are also supplied to the PMOS counter value retention circuit 37.

The PMOS counter value retention circuit 37 retains the binary control signals PCB1 to PCB4 in response to the clock signal C2. By the binary control signals being supplied to pull-up circuit PU, the pull-up resistance of the pull-up circuit PU becomes the same value as the pull-up resistance of the PMOS array 36, that is, becomes the same value as that of the external resistor R30.

In this way, the value of resistance of the pull-down circuit PD and the value of resistance of the pull-up circuit PU are controlled to correspond to the external resistance R20 and external resistance R30 respectively, and the output impedance of the output circuit 23 are maintained at a desired value all the time.

Figure 7:
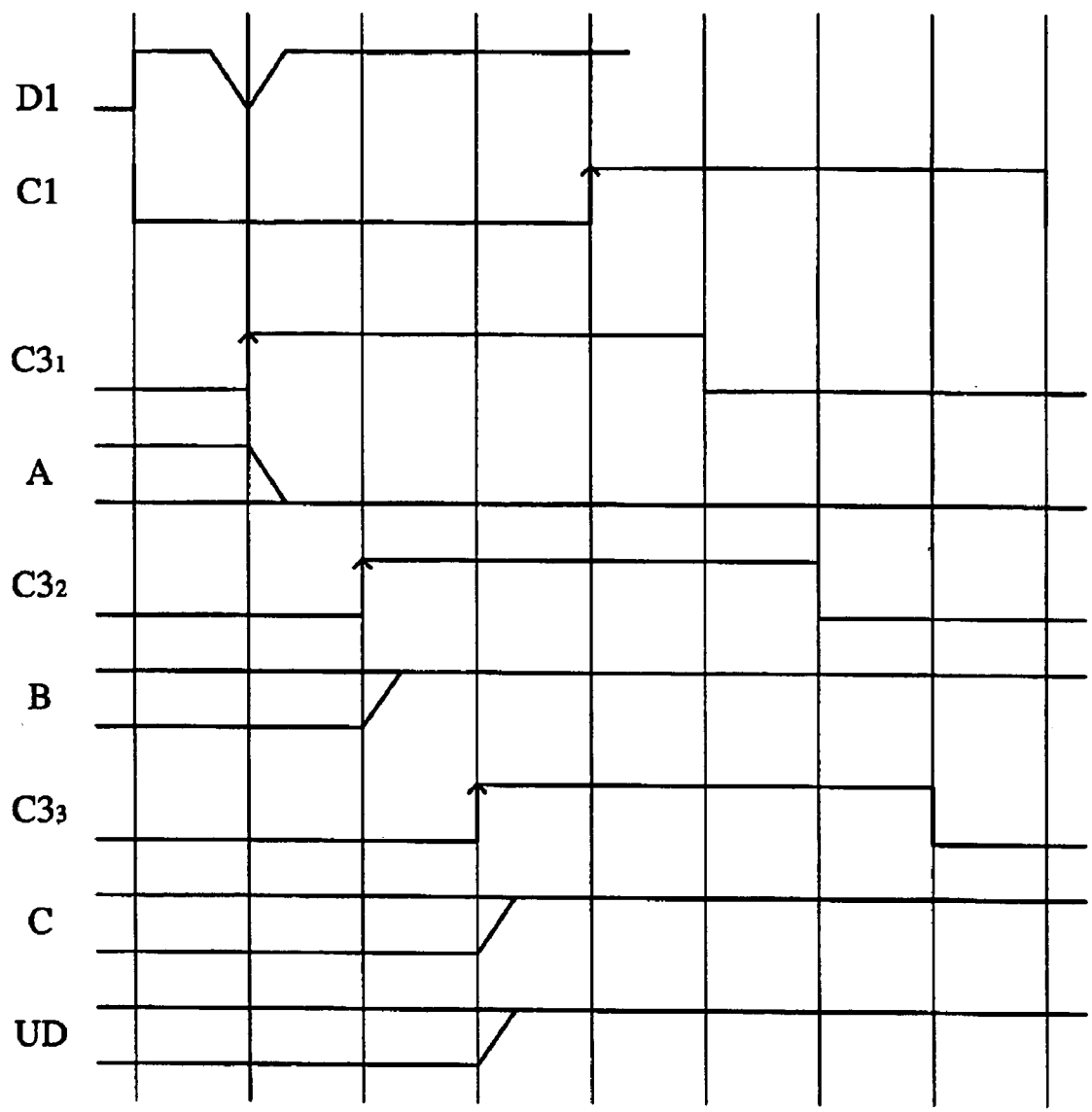
FIG. 7 is a timing chart showing the condition of each signal inside an arbitration circuit.

Next, an operation related to the interior of the arbitration circuits 24 and 34 will be explained with reference to a timing chart shown in FIG. 7. FIG. 7 is a timing chart showing the condition of each signal inside the arbitration circuits 24 and 34.

The arbitration circuits 24 and 34 use the three clock signals $C3_1$, $C3_2$, and $C3_3$ which are different in timing. The F/Fs 41, 42, and 43 latch the input signal D1 in synchronization with a rise of the clock signals $C3_1$, $C3_2$, and $C3_3$ respectively, and output the latched signal.

While the impedance adjustment circuit 21 or 31 is operating, a signal retaining the input signal D1 representing the level of the impedance of the array 26 or 36 is normally output.

However, if, for example, a noise is mixed into the input signal D1 at a timing at which the clock signal $C3_1$ rises due to some cause, the F/F 41 synchronous with the clock signal $C3_1$ retains a falsely detected result.

That is, in the example shown in FIG. 7, a signal that should properly be a high-level signal becomes a low-level signal. An impedance adjustment circuit having no arbitration circuit 24 or 34 would let the counter 25 or 35 interchange upcounting and downcounting.

As a result, the counter 25 or 35 would transmit an erroneous binary code to the NMOS array 26 or PMOS array 36.

The arbitration circuit 24 or 34 has, in addition to the F/F 41 having output an erroneous signal, the F/F 42 and F/F 43 to which the clock signals C32 and C33 different in timing are input.

Therefore, the noise mixed into the input signal D1 at the timing at which the clock signal $C3_1$ rises is not detected by the F/F 42 or the F/F 43, and the output signals from both of them become the proper ones.

As a result, since the output signals. B and C are proper although the output signal A is an error, the signal U/D, which is the majority decision logic signal of the signals A, B, and C, is a proper one.

As described above, by acquiring the output D1 from the comparator 23 or 33 in response to a plurality of clock signals different in timing and by taking majority decision logic, it is possible to prevent an erroneous detection of a signal due to a noise, etc.

That is, the impedance adjustment circuit 13 can perform impedance adjustment without malfunctioning, even if a noise (power supply noise, etc.) is caused inside the impedance adjustment circuit 13 or the LSI 10, or if a noise from surrounding circuits comes.

The example where a noise is caused at the timing of the clock signal $C3_1$ has been explained. A noise caused at the timing of the clock signal $C3_2$ or $C3_3$ can be corrected in the same manner. The present invention is not limited to the above-described embodiment, but various modifications and applications are available.

For example, in the above-described embodiment, the value of "m" related with the arbitration circuits 24 and 34 is 3. However, it may be an arbitrary integer equal to or greater than 4.

In this case, generally, if there are "m" number of F/Fs, the number of all combinations made up of outputs from two of these F/Fs is represented by m*(m–1)/2. Therefore, m*(m–1)/2 number of two-input NAND gates are necessary.

However, as a simplified configuration without the use of all the combinations made up of outputs from two of the F/Fs, a configuration in which the number of two-input NAND gates is reduced is available. In this case, it is necessary to use a sufficient number of NAND gates for the majority decision logic output to eliminate an erroneous signal.

In the above-described embodiment, the present invention has been explained by employing the case of adjusting the output impedance as an example. However, the present invention is not limited to this, but may be applied to a case of adjusting an input impedance.

Figure 8:
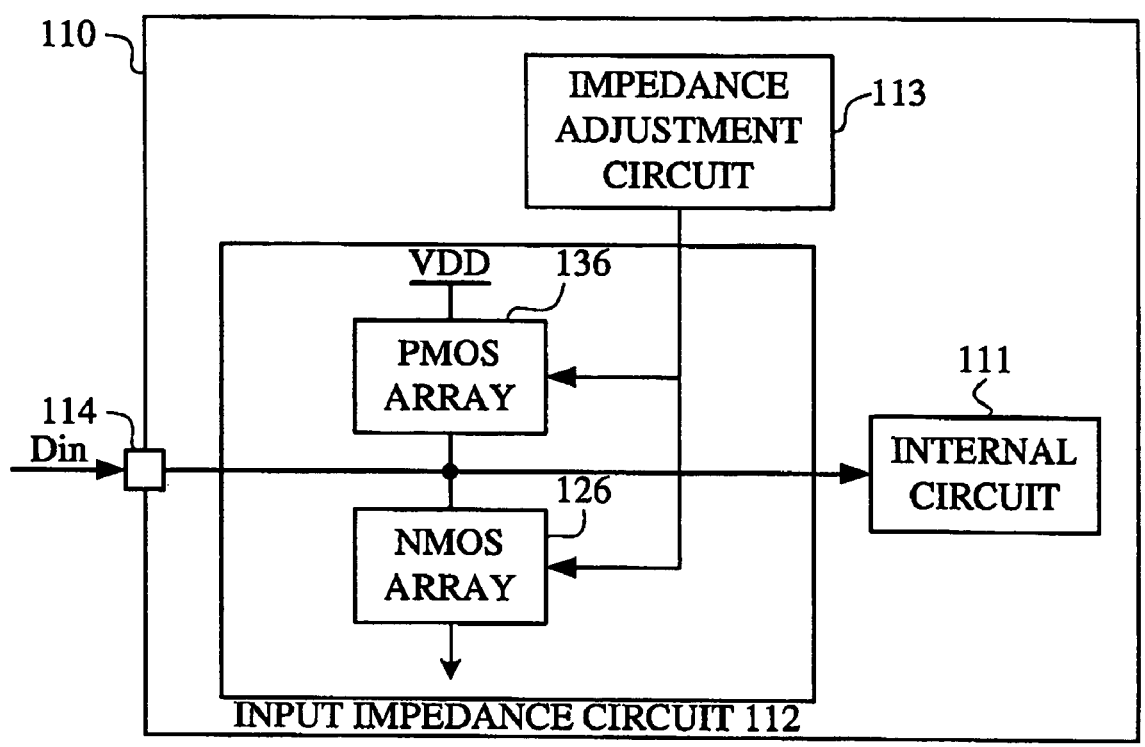
FIG. 8 is a circuitry diagram showing an example of configuration of a semiconductor device in a case where the present invention is applied to an input impedance adjustment circuit.

FIG. 8 is a circuitry diagram showing a configuration of an LSI circuit in a case where the present invention is applied to an input impedance circuit As shown in FIG. 8, the LSI circuit 110 is configured such that an input impedance circuit 112 is provided on a signal line for supplying input data Din from the outside to an internal circuit 111.

The input impedance circuit 112 has an NMOS array 126 and a PMOS array 136 which have the same configuration as that of the NMOS array 26 and PMOS array 36 shown in FIG. 3. The impedance of each array of the input impedance circuit 112 is adjusted by an impedance adjustment circuit 113.

With this configuration, it is possible to maintain the input impedance of the LSI circuit 110 at an appropriate value by appropriately adjusting the impedance of each array.

The input impedance circuit 112 may be configured as a buffer circuit as shown in FIG. 2. The impedance of each array is adjusted by the impedance adjustment circuit 113.

Further, in the above-described embodiment, a circuit having a pull-down circuit and a pull-up circuit as a pair has been illustrated as an impedance circuit. However, the present invention can widely be used to a case of adjusting the impedance of a pull-down circuit or a pull-up circuit used solely.

In the above-described embodiment, a circuit constituted by a parallel circuit made up of a plurality of MOS transistors has been illustrated as an adjusting-target impedance circuit. However, the configuration of the impedance circuit is arbitrary as long as the impedance can be adjusted by an external control signal.

In the above-described embodiment, for easier understanding, the circuit configuration of the adjusting-target pull-down circuit PD and the circuit configuration of the adjusting (simulating) NMOS array 26 are the same, and the circuit configuration of the adjusting-target pull-up circuit PU and the circuit configuration of the adjusting (simulating) PMOS array 36 are the same. However, these may be different from each other.

In a case where the configuration of the adjusting-target impedance circuit and that of the adjusting (simulating) array circuit are different, the condition of the adjusting-target impedance circuit may be determined and adjusted based on the condition of the adjusting (simulating) array circuit in accordance with a predetermined conversion rule.

In the above-described embodiment, for easier understanding, the impedance of the pull-down circuit PD and the impedance of the pull-up circuit PU are set to be the same as that of the external resistor R20 and external resistor R30 respectively, and the reference potentials Vrn and Vrp are set to be ½ of the power supply voltage VDD. However, the values of resistance and the reference potentials may be arbitrarily set.

Further, there has been explained a case where the pull-down circuit is constituted by N-channel MOS transistors and the pull-up circuit is constituted by P-channel MOS transistors. However, the pull-down circuit and the pull-up circuit may both be constituted by N-channel MOS transistors, or the pull-down circuit and the pull-up circuit may both be constituted by P-channel MOS transistors.

Various embodiments and changes may be made thereunto without departing from the broad spirit and scope of the invention. The above-described embodiment is intended to illustrate the present invention, not to limit the scope of the present invention. The scope of the present invention is shown by the attached claims rather than the embodiment. Various modifications made within the meaning of an equivalent of the claims of the invention and within the claims are to be regarded to be in the scope of the present invention.

This application is based on Japanese Patent Application No. 2003-188721 filed on Jun. 30, 2003 and including specification, claims, drawings and summary. The disclosure of the above Japanese Patent Application is incorporated herein by reference in its entirety.

What is claimed is:

1. A circuit comprising:
   an impedance adjustment circuit which performs simulation of a behavior of an array circuit and adjusts an impedance of said array circuit in accordance with a simulation result,
   wherein said impedance adjustment circuit performs the simulation a plurality of times at different timings, and adjusts the impedance of said array circuit in accordance with a majority decision logic taken on results of the simulation performed the plurality of times.

2. The circuit according to claim 1, wherein
   said array circuit is constituted by a transistor array, and
   said impedance adjustment circuit comprises:
   an adjusting array circuit which simulates the behavior of said array circuit;
   a plurality of sampling circuits which sample results of simulation by said adjusting array circuit at different timings; and
   an adjustment circuit which controls a behavior of said adjusting array circuit and also controls turning on/off of transistors constituting said array circuit in accordance with a majority decision logic taken on outputs from said plurality of sampling circuits.

3. A semiconductor device comprising:
   an adjusting-target impedance circuit which is constituted by a parallel circuit made up of a plurality of transistors; and
   an impedance adjustment circuit which adjusts an impedance of said impedance circuit,
   wherein
   said impedance adjustment circuit includes:
   a signal line;
   an adjusting impedance circuit whose one terminal is connected to said signal line and whose other terminal has a first voltage applied thereto, and which is constituted by a parallel circuit made up of a plurality of transistors;
   a comparison circuit which compares a voltage of said signal line with a second voltage;
   sampling circuits which sample outputs from said comparison circuit at different timings;
   majority decision circuits which arbitrate the outputs from said comparison circuit sampled at a plurality of timings by said sampling circuits in accordance with a majority decision logic, and output an arbitration output; and
   a control circuit which updates a counted value in accordance with the output from said majority decision circuits, and controls each transistor constituting said adjusting-target impedance circuit and each transistor constituting said adjusting impedance circuit in accordance with the counted value.

4. A semiconductor device comprising:
   an adjusting-target impedance circuit which is constituted by a plurality of transistors; and
   an impedance adjustment circuit which adjusts an impedance of said impedance circuit,
   wherein
   said impedance adjustment circuit includes:
   a signal line;
   an adjusting impedance circuit whose one terminal is connected to said signal line and whose other terminal has a first voltage applied thereto, and which is constituted by a plurality of transistors;
   a comparison circuit which compares a voltage of said signal line with a second voltage;
   sampling circuits which sample outputs from said comparison circuit in response to a plurality of timing signals;
   majority decision circuits which arbitrate the plurality of outputs from said comparison circuit sampled by said sampling circuits in accordance with a majority decision logic, and output an arbitration output; and
   a control circuit which updates a counted value in accordance with the output from said majority decision circuits, and controls each transistor constituting said adjusting-target impedance circuit and each transistor constituting said adjusting impedance circuit in accordance with the counted value.

5. An impedance adjustment circuit comprising:
   an adjusting-target impedance circuit which is constituted by a plurality of transistors;
   a signal line;
   an adjusting impedance circuit whose one terminal is connected to said signal line and whose other end has a first voltage applied thereto, and which is constituted by a plurality of transistors;
   a comparison circuit which compares a voltage of said signal line with a second voltage;
   sampling circuits which sample outputs from said comparison circuit at different timings;
   majority decision circuits which arbitrate the outputs from said comparison circuit sampled at a plurality of timings by said sampling circuits in accordance with a majority decision logic, and output an arbitration output; and
   a control circuit which updates a counted value in accordance with the output from said majority decision circuits, and controls each transistor constituting said adjusting-target impedance circuit and each transistor constituting said adjusting impedance circuit in accordance with the counted value.

6. An impedance adjustment method for adjusting an impedance of an adjusting-target impedance circuit which is constituted by a plurality of transistors, said method comprising:

comparing an output voltage of a voltage dividing circuit which is constituted by an adjusting reference impedance and an adjusting impedance circuit constituted by a parallel circuit made up of a plurality of transistors, with a predetermined reference voltage, and outputting a comparison result;

sampling the comparison result at different timings;

arbitrating the comparison result sampled at a plurality of timings in accordance with a majority decision logic, and outputting an arbitration result; and controlling each transistor constituting said adjusting-target impedance circuit and each transistor constituting said adjusting impedance circuit in accordance with the arbitration result.

* * * * *